(12) United States Patent
Adusumilli et al.

(10) Patent No.: US 11,195,715 B2
(45) Date of Patent: Dec. 7, 2021

(54) EPITAXIAL GROWTH CONSTRAINED BY A TEMPLATE

(71) Applicant: GLOBALFOUNDRIES U.S. Inc., Santa Clara, CA (US)

(72) Inventors: Siva P. Adusumilli, South Burlington, VT (US); Cameron Luce, Colchester, VT (US); Ramsey Hazbun, Colchester, VT (US); Mark Levy, Williston, VT (US); Anthony K. Stamper, Williston, VT (US); Alvin J. Joseph, Williston, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 9 days.

(21) Appl. No.: 16/821,228

(22) Filed: Mar. 17, 2020

(65) Prior Publication Data

US 2021/0296122 A1  Sep. 23, 2021

(51) Int. Cl.
*H01L 21/02* (2006.01)
*H01L 21/762* (2006.01)
*H01L 21/324* (2006.01)

(52) U.S. Cl.
CPC ...... *H01L 21/02293* (2013.01); *H01L 21/324* (2013.01); *H01L 21/76229* (2013.01)

(58) Field of Classification Search
CPC ............. H01L 21/02293; H01L 21/324; H01L 21/76229
See application file for complete search history.

(56) References Cited

U.S. PATENT DOCUMENTS

| | | | |
|---|---|---|---|
| 4,522,662 A | 6/1985 | Bradbury et al. | |
| 4,670,088 A | 6/1987 | Tsaur et al. | |
| 4,760,036 A | 7/1988 | Schubert | |
| 4,948,456 A | 8/1990 | Schubert | |
| 5,258,318 A * | 11/1993 | Buti | H01L 21/76264 148/DIG. 9 |
| 7,435,639 B2 | 10/2008 | Winstead et al. | |
| 8,759,203 B2 * | 6/2014 | Wann | H01L 21/02639 438/481 |
| 10,192,779 B1 | 1/2019 | Shank et al. | |
| 2019/0295881 A1 | 9/2019 | Shank et al. | |
| 2021/0066472 A1 * | 3/2021 | Wu | H01L 21/0228 |

OTHER PUBLICATIONS

JP Colinge, "Polysilicon Melting and Recrystallization, in Silicon-on-insulator technology: materials to VLSI", 2004, pp. 16-19.
Celler et al., "Spatially controlled crystal regrowth of ion-implanted silicon by laser irradiation", Appl. Phys. Lett. 32, 464 (1978).

* cited by examiner

*Primary Examiner* — Quoc D Hoang
(74) *Attorney, Agent, or Firm* — Thompson Hine LLP

(57) ABSTRACT

Methods of forming structures with electrical isolation. A dielectric layer is formed over a semiconductor substrate, openings are patterned in the dielectric layer that extend to the semiconductor substrate, and a semiconductor material is epitaxially grown from portions of the semiconductor substrate that are respectively exposed inside the openings. The semiconductor material, during growth, defines a semiconductor layer that includes first portions respectively coincident with the openings and second portions that laterally grow from the first portions to merge over a top surface of the dielectric layer. A modified layer containing a trap-rich semiconductor material is formed in the semiconductor substrate.

20 Claims, 6 Drawing Sheets

EPITAXIAL GROWTH CONSTRAINED BY A TEMPLATE

BACKGROUND

The present invention relates to semiconductor device fabrication and integrated circuits and, more specifically, to methods of forming structures with electrical isolation.

A silicon-on-insulator (SOI) wafer includes a top device layer of silicon, a handle substrate, and a thin buried oxide (BOX) layer physically separating and electrically isolating the top device layer from the handle substrate. Devices fabricated using SOI technologies may exhibit certain performance improvements over comparable devices built using a bulk silicon wafer. For example, the BOX layer of an SOI wafer provides a bottom dielectric isolation that may suppress sub-channel leakage. However, silicon-on-insulator (SOI) wafers cost significantly more than bulk silicon wafers. In addition, SOI wafers are limited regarding the provision of a custom top device layer.

Improved methods of forming structures with electrical isolation are needed.

SUMMARY

In an embodiment of the invention, a method includes forming a dielectric layer over a semiconductor substrate, patterning openings in the dielectric layer that extend to the semiconductor substrate, and epitaxially growing a semiconductor material from portions of the semiconductor substrate that are respectively exposed inside the openings. The semiconductor material, during growth, defines a semiconductor layer that includes first portions respectively coincident with the openings and second portions that laterally grow from the first portions to merge over a top surface of the dielectric layer. The method further includes forming a modified layer containing a trap-rich semiconductor material in the semiconductor substrate.

In an embodiment of the invention, a method includes forming of shallow trench isolation regions in a semiconductor substrate, recessing the shallow trench isolation regions relative to portions of the semiconductor substrate that are surrounded by the shallow trench isolation regions, and epitaxially growing a semiconductor material from the portions of the semiconductor substrate. The semiconductor material laterally grows from the portions of the semiconductor substrate to merge over a top surface of the shallow trench isolation regions to define a semiconductor layer. The method further includes forming a modified layer containing a trap-rich semiconductor material in the semiconductor substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
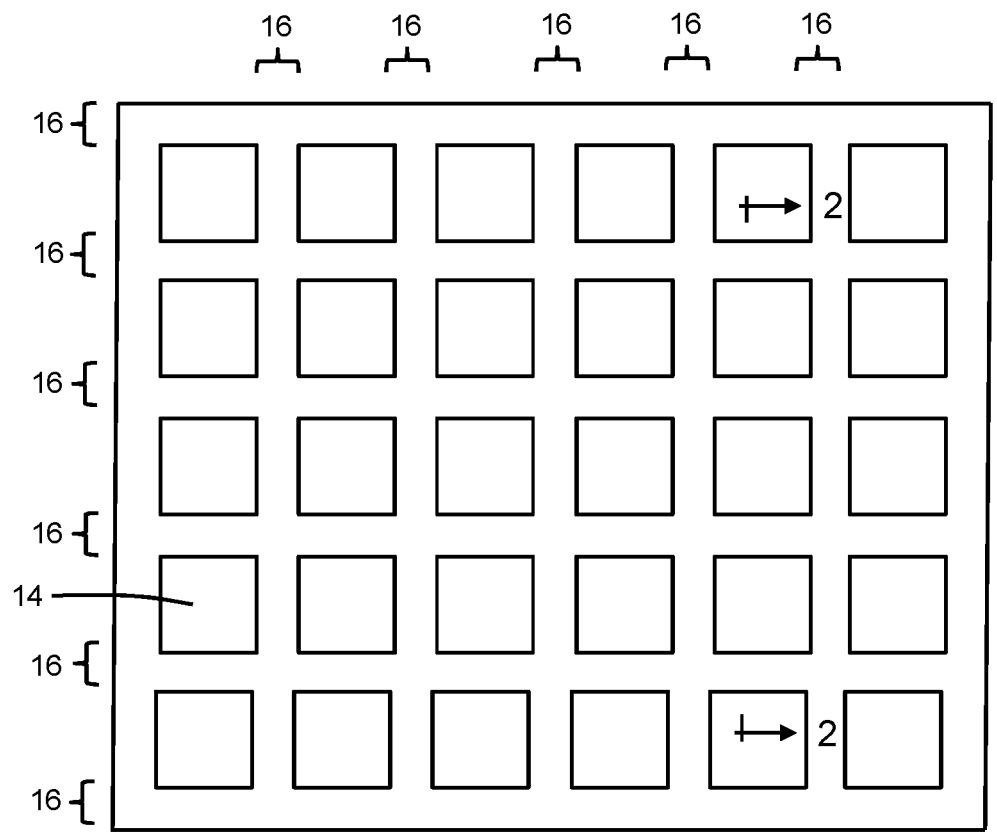
FIG. 1 is a top view of a structure at an initial fabrication stage of a processing method in accordance with embodiments of the invention.
Figure 2:
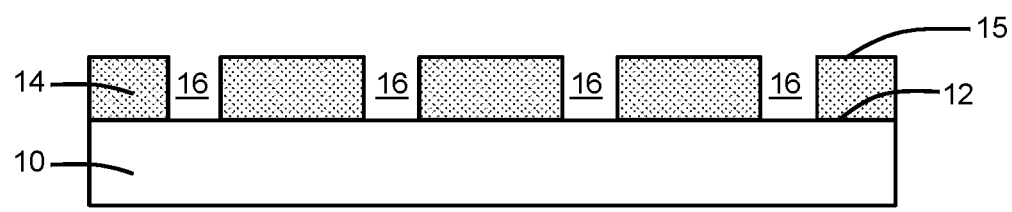
FIG. 2 is a cross-sectional view taken generally along line 2-2 in FIG. 1.

With reference to FIGS. 1, 2 and in accordance with embodiments of the invention, a substrate 10 is provided that is composed of a monocrystalline or single-crystal semiconductor material, such as single-crystal silicon. The substrate 10 may be, for example, a bulk semiconductor wafer composed of single-crystal semiconductor material, such as a bulk silicon wafer composed of single-crystal silicon, and that differs from silicon-on-insulator (SOI) wafer due to, among other factors, the absence of a buried oxide layer. A dielectric layer 14 may be formed on the top surface 12 of the substrate 10. The dielectric layer 14 may be composed of a dielectric material, such as silicon dioxide either deposited by chemical vapor deposition or grown by thermal oxidation.

Trenches 16 are formed as openings in the dielectric layer 14 by patterning the dielectric layer 14 with lithography and etching processes. The lithography process may include forming an etch mask by applying a layer of an organic photoresist by a spin coating process, pre-baking, exposing the photoresist to electromagnetic radiation projected through a photomask, baking after exposure, and developing with a chemical developer to define an opening over the intended locations of the trenches 16. One or more etching processes, such as reactive ion etching processes, may be used to form the trenches 16 with the etch mask present. The etch mask may be stripped after forming the trenches 16.

The trenches 16 penetrate from a top surface 15 of the dielectric layer 14 fully through dielectric layer 14 to the substrate 10. The trenches 16 are arranged in a pattern that may define a lattice or mesh of interconnected openings that partition the dielectric layer 14 into discrete sections. In the representative embodiment, the trenches 16 may define rectangular sections of the dielectric layer 14 that are arranged in a grid and each covered region is fully surrounded by the trenches 16. In an embodiment, the rectangular sections of the dielectric layer 14 may have an area of ten (10) microns by ten (10) microns, and the trenches 16 may have a width of one (1) micron. In an alternative embodiment, the trenches 16 may be patterned to provide sections of the dielectric layer 14 that have a round shape, a diamond shape, etc. Portions of the top surface 12 of the substrate 10 that are exposed at the respective bottoms of the trenches 16.

Figure 3:
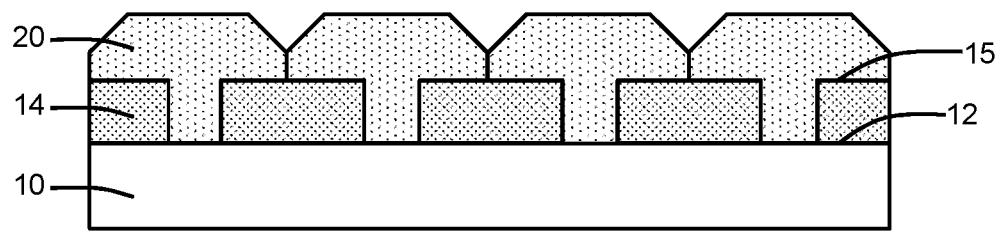
FIGS. 3-6 are cross-sectional views of the structure at successive fabrication stages subsequent to FIG. 2.

With reference to FIG. 3 in which like reference numerals refer to like features in FIG. 2 and at a subsequent fabrication stage of the processing method, a semiconductor layer 20 is formed by epitaxial growth from the exposed portions of the top surface 12 of the substrate 10 at the bottoms of the trenches 16. The semiconductor layer 20 may be grown by an epitaxial growth process using the substrate 10 as a crystal structure template. The semiconductor layer 20 may be composed of a single-crystal semiconductor material, such as single-crystal silicon. The semiconductor layer 20 grows as individual portions that fill the trenches 16 and, after the trenches 16 are filled, that laterally overgrow over the top surface 15 of the dielectric layer 14 and merge to define a continuous coating over the dielectric layer 14. The epitaxial growth process may be selective in that semiconductor material does not grow from the surfaces of the dielectric layer 14 bounding the trenches 16 or the top surface 15 of the dielectric layer 14.

The semiconductor layer 20 may include irregularities and a varying thickness. For example, the semiconductor layer 20 may include divots at the locations of the merged lateral growth fronts between the trenches 16 and over the dielectric layer 14. In an alternative embodiment, the epitaxial growth conditions may be selected such that the merger of the different growth fronts lacks significant irregularities. The semiconductor layer 20 defines a continuous coating and the dielectric layer 14 is positioned between the substrate 10 and the semiconductor layer 20 other than where connected by the portions of the semiconductor layer 20 in the trenches 16. Seams are visible in FIG. 3 between the merged portions of the semiconductor layer 20 for the purpose of illustrating the formation of the semiconductor layer 20, and may not be present in the semiconductor layer 20 as illustrated, for example, in FIG. 4.

Figure 4:
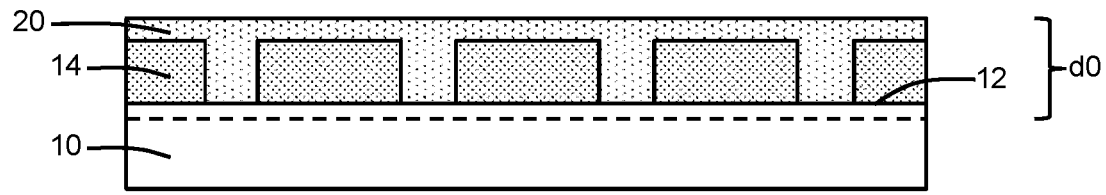

With reference to FIG. 4 in which like reference numerals refer to like features in FIG. 3 and at a subsequent fabrication stage of the processing method, the semiconductor layer 20 may be polished with chemical-mechanical polishing subsequent to its epitaxial growth. The polishing may remove irregularities and provide the semiconductor layer 20 with a planar or substantially planar top surface and a uniform or substantially uniform thickness.

The semiconductor layer 20 and a portion of the substrate 10 beneath the dielectric layer 14 and semiconductor layer 20 may be modified by an ion implantation process to introduce crystalline damage over a depth, d0. The substrate 10 may be unmodified by the ion implantation process at depths greater than depth, d0, and therefore remain single-crystal semiconductor material at these depths. The ions may be generated from a suitable source gas and implanted into the substrate 10 and semiconductor layer 20 with a set of implantation conditions using an ion implantation tool. The conditions (e.g., ion species, dose, kinetic energy) of the implantation may be selected to tune the characteristics of the damage to the crystal lattice structure over the depth, d0. In an embodiment, the implanted ions may be generated from argon or another type of noble atom gas or inert gas. The ion dose for the ion implantation process is selected to be less than a threshold dose beyond which recrystallization of the damaged semiconductor material by a subsequent anneal is impossible.

Figure 5:
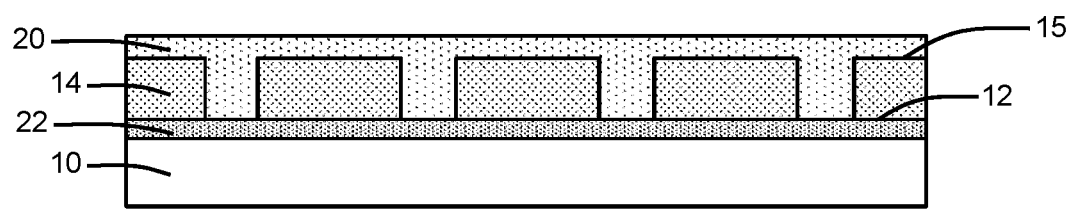

With reference to FIG. 5 in which like reference numerals refer to like features in FIG. 4 and at a subsequent fabrication stage of the processing method, the damaged semiconductor material of the substrate 10 and semiconductor layer 20 may be subjected to a thermal treatment (i.e., annealing process). In an embodiment, a rapid thermal anneal may be performed as the thermal treatment used to thermally treat the implanted and damaged semiconductor material of the substrate 10 and semiconductor layer 20. In an embodiment, the rapid thermal anneal may be performed using, for example, a bank of flash lamps that heat the substrate 10 and semiconductor layer 20 to a peak temperature in a range of 850° C. to 1125° C. and with a dwell time at the peak temperature of 30 milliseconds to 60 seconds. The thermal treatment recrystallizes the implanted and damaged semiconductor material of the semiconductor layer 20 back into single-crystal semiconductor material and recrystallizes the damaged semiconductor material of the substrate 10 into a modified layer 22 of polycrystalline semiconductor material. The modified layer 22 is trap rich and has a high electrical resistivity (e.g., an electrical resistivity greater than or equal to 100 ohm-cm). The single-crystal semiconductor material of the substrate 10, which is arranged below the damaged portion of the substrate 10, provides a crystalline template for recrystallization. The modified layer 22 of polycrystalline semiconductor material is positioned beneath the dielectric layer 14 and may be in direct contact with the dielectric layer 14 and the portions of the semiconductor layer 20 inside the trenches 16. The portions of the semiconductor layer 20 above the modified layer 22 recrystallize back into single-crystal semiconductor material following the thermal treatment.

In an alternative embodiment, the ion implantation process may be omitted, as well as the subsequent thermal treatment, such that the modified layer 22 of polycrystalline semiconductor material is absent.

Figure 6:
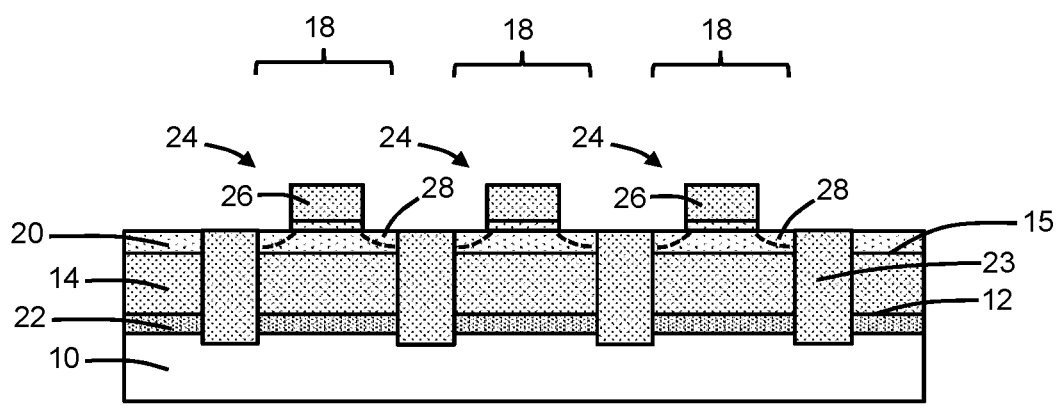

With reference to FIG. 6 in which like reference numerals refer to like features in FIG. 5 and at a subsequent fabrication stage of the processing method, shallow trench isolation regions 23 may be formed in the semiconductor layer 20 at the locations of the trenches 16. The shallow trench isolation regions 23 may formed at locations that coincide with the locations of the trenches 16. The shallow trench isolation regions 23 may penetrate or extend fully through the semiconductor layer 20 and the dielectric layer 14 at the locations of the trenches 16, and the shallow trench isolation regions 23 may penetrate or extend fully through the modified layer 22 of polycrystalline semiconductor material to a shallow depth into the substrate 10 beneath the modified layer 22. The shallow trench isolation regions 23 define and surround active device regions 18 of the semiconductor layer 20. The shallow trench isolation regions 23 may be provided by patterning the semiconductor materials of the semiconductor layer 20, the modified layer 22, and the substrate 10 with lithography and etching processes to define trenches and forming planarized portions of a deposited dielectric material (e.g., silicon dioxide) in the trenches. The modified layer 22 and the shallow trench isolation regions 23 may have a contacting relationship.

Field-effect transistors 24 may be formed by front-end-of-line (FEOL) processing in the active device regions 18. Each field-effect transistor 24 may include a gate electrode 26 and a gate dielectric formed by depositing a layer stack and patterning the layer stack with photolithography and etching processes. The gate electrode 26 may be composed of a conductor, such as doped polycrystalline silicon (i.e., polysilicon) or a work function metal, and the gate dielectric may be composed of an electrical insulator, such as silicon dioxide or hafnium oxide. The field-effect transistor 24 may include other elements such as halo regions, lightly doped drain extensions, source/drain regions 28 in the semiconductor layer 20, and sidewall spacers on the gate electrode 26. In an alternative embodiment, a different type of transistor, such as a heterojunction bipolar transistor, may be fabricated in the active device regions instead of the field-effect transistors 24.

Middle-of-line processing and back-end-of-line processing follow, which includes formation of silicide, contacts, vias, and wiring for an interconnect structure coupled with the field-effect transistors 24.

Figure 7:
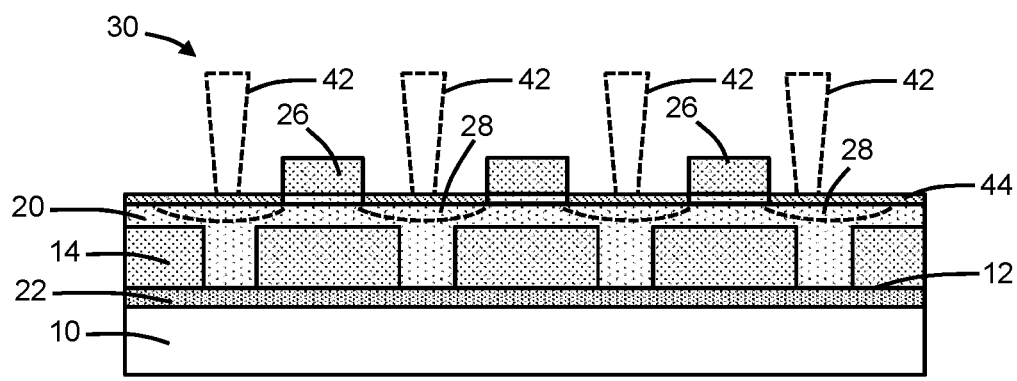
FIGS. 7 and 8 are cross-sectional views of structures in accordance with alternative embodiments of the invention.

With reference to FIG. 7 in which like reference numerals refer to like features in FIG. 5 and in accordance with alternative embodiments, a multi-finger field-effect transistor 30 similar to the field-effect transistor 24 may be formed after the damaged semiconductor material of the substrate 10 and semiconductor layer 20 is subjected to the thermal treatment. The shallow trench isolation regions 23 are not formed after the formation of the modified layer 22 of polycrystalline semiconductor material. The portions of the semiconductor layer 20 filling the trenches 16 and respective portions of the semiconductor layer 20 directly above the trenches 16 may contain residual crystalline damage in the form of defects following recrystallization. Each source/drain region 28 may have an area in the transistor layout that is greater than the area of each trench 16 and, therefore, the portion of the semiconductor layer 20 filling each trench 16. The gate electrodes 26 providing the multiple fingers of the multi-finger field-effect transistor 30 may be arranged in the layout spaced from the portions of the semiconductor layer 20 in and above the trenches 16.

Middle-of-line processing and back-end-of-line processing follow, which includes formation of silicide, contacts, vias, and wiring for an interconnect structure coupled with the field-effect transistor 30. In particular, sections of a silicide layer 44 are respectively formed over the portions of the semiconductor layer 20 filling the trenches 16. The sections of the silicide layer 44 may consume portions of the semiconductor layer 20 generally over the portions of the semiconductor layer 20 in the trenches 16 and bridge across the damaged semiconductor material. Source/drain contacts 42 are formed that are coupled with the sections of the silicide layer 44.

Figure 8:
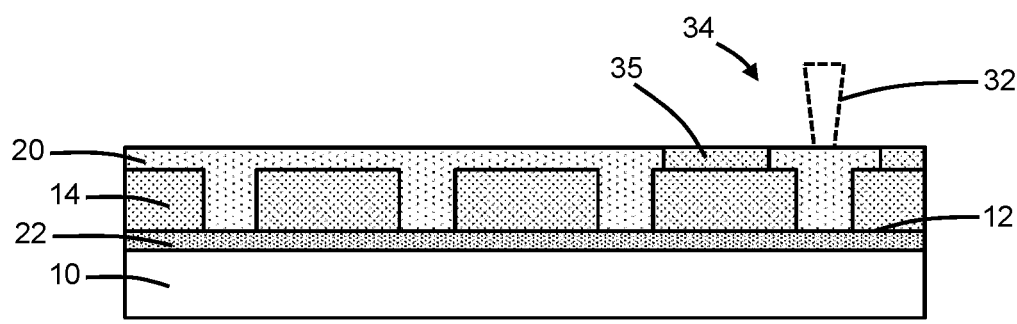

With reference to FIG. 8 in which like reference numerals refer to like features in FIG. 5 and in accordance with alternative embodiments, portions of the semiconductor layer 20 may be located in connected trenches 16 that surround the outer perimeter of the active device regions 18 used to form the field-effect transistors 24 or the multi-finger field-effect transistor 30. These portions of the semiconductor layer 20 may not be replaced by dielectric material and, instead, may be contacted by one or more contacts 32 to define a guard ring 34. In that regard, the portions of the semiconductor layer 20 may be electrically isolated from the active device regions 18 by shallow trench isolation regions 35. The isolated portions of the semiconductor layer 20 filling the trenches 16 are coupled to the substrate 10 beneath the dielectric layer 14.

Figure 9:
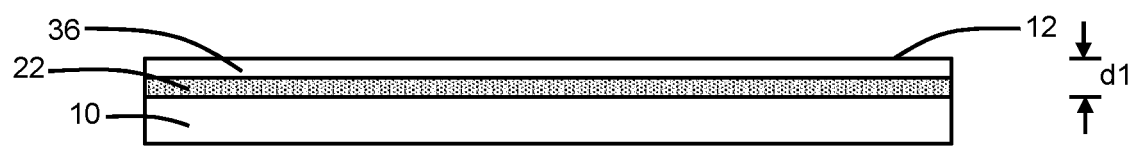
FIGS. 9-10 are cross-sectional views of a structure at successive fabrication stages of a processing method in accordance with embodiments of the invention.

With reference to FIG. 9 in which like reference numerals refer to like features in FIG. 1 and in accordance with alternative embodiments, a portion of the substrate 10 at and beneath the top surface 12 over a shallow depth may be modified by the ion implantation process to introduce crystalline damage extending over a depth, d1, as described in connection with FIG. 3. The substrate 10 may be unmodified by the ion implantation process at depths greater than depth, d1, and therefore remain single-crystal semiconductor material at these depths. As described in connection with FIG. 4, the thermal treatment may be employed to recrystallize the implanted and damaged semiconductor material of the substrate 10 to form the modified layer 22 of polycrystalline semiconductor material and to recrystallize the overlying damaged section 36 of the substrate 10 back into single-crystal semiconductor material.

Figure 10:
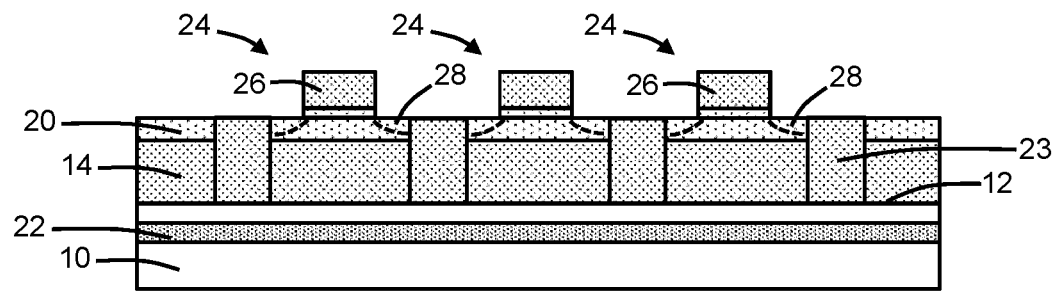

With reference to FIG. 10 in which like reference numerals refer to like features in FIG. 9 and at a subsequent fabrication stage of the processing method, the dielectric layer 14 may be deposited over the substrate 10, the trenches 16 may be defined in the dielectric layer 14, and the semiconductor layer 20 may be epitaxially grown using portions of the substrate 10 that are exposed by the trenches 16 as a growth template and then planarized. Subsequently, the shallow trench isolation regions 23 may be formed and may replace the portions of the semiconductor layer 20 in the trenches 16 without penetrating into and/or extending through the modified layer 22. The recrystallized section of the substrate 10 is located between the shallow trench isolation regions 23 and the modified layer 22. The field-effect transistors 24 may then be formed using the semiconductor layer 20. Alternatively, the multi-finger field-effect transistor 30 (FIG. 7) may be formed.

Figure 11:
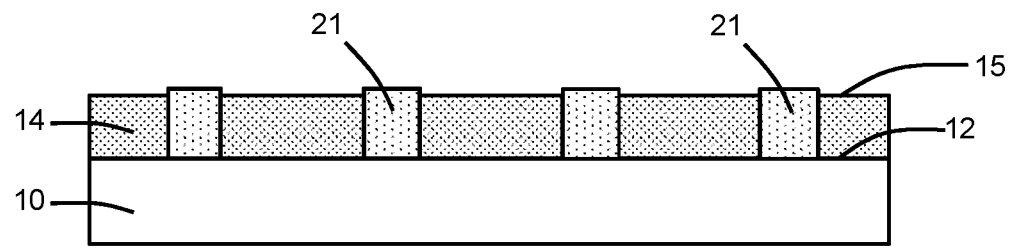
FIGS. 11-14 are cross-sectional views of a structure at successive fabrication stages of a processing method in accordance with embodiments of the invention.

With reference to FIG. 11 in which like reference numerals refer to like features in FIG. 2 and in accordance with alternative embodiments, the semiconductor layer 20 may be formed by epitaxial growth in stages from the exposed portions of the top surface 12 of the substrate 10 at the bottoms of the trenches 16. In that regard, a sub-layer 21 of the semiconductor layer 20 may be grown in an initial stage by an epitaxial growth process using the substrate 10 as a crystal structure template. The sub-layer 21 may be composed of a single-crystal semiconductor material, such as single-crystal silicon. The sub-layer 21 grows as individual portions that fill the trenches 16 and, after the trenches 16 and may slightly protrude out of the trenches 16. The epitaxial growth is halted before any lateral growth of significance can occur.

Figure 12:
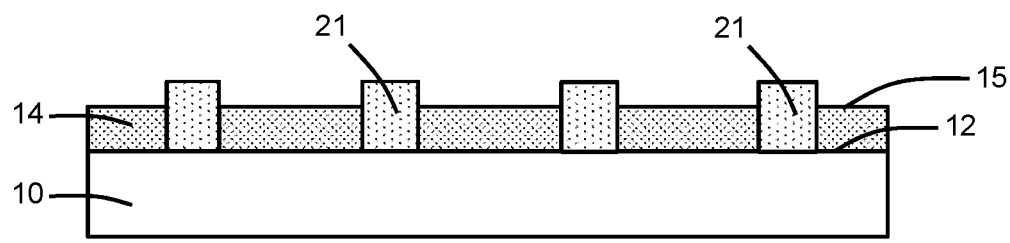

With reference to FIG. 12 in which like reference numerals refer to like features in FIG. 11 and at a subsequent fabrication stage of the processing method, the dielectric layer 14 is recessed relative to the portions of the sub-layer 21 in the trenches 16 using a selective etching process. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The recessing of the dielectric layer 14 increases a height of each portion of the sub-layer 21 that is located above a top surface 15 of the dielectric layer 14.

Figure 13:
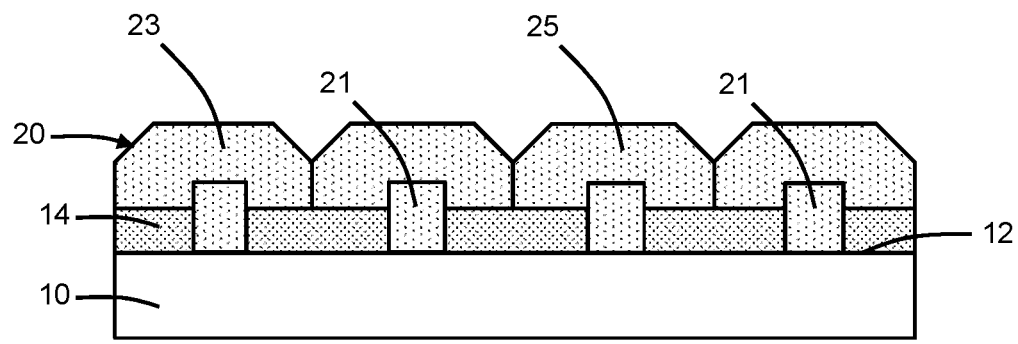

With reference to FIG. 13 in which like reference numerals refer to like features in FIG. 12 and at a subsequent fabrication stage of the processing method, a sub-layer 25 of the semiconductor layer 20 is then grown in a subsequent stage by an epitaxial growth process using the portions of the sub-layer 21 as a crystal structure template. Portions of the sub-layer 25 laterally overgrow over the top surface 15 of the dielectric layer 14 from the different portions of the sub-layer 21 and these portions of the sub-layer 25 merge to define a continuous coating above the dielectric layer 14. The epitaxial growth process may be selective in that semiconductor material does not grow from the surfaces of the dielectric layer 14.

Figure 14:
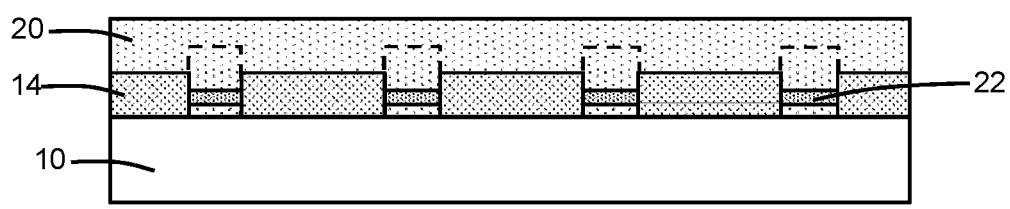

With reference to FIG. 14 in which like reference numerals refer to like features in FIG. 13 and at a subsequent fabrication stage of the processing method, processing may continue as described in connection with FIGS. 4-5. In that regard, the formation of the shallow trench isolation regions 23 may be omitted, and the modified layer 22 of polycrystalline semiconductor material may be formed at a shallower depth such that the modified layer 22 overlaps with the portions of the semiconductor layer 20 in the trenches 16. In this instance, the modified layer 22 overlaps with the sub-layer 21 of the semiconductor layer 20. The multi-finger field-effect transistor 30 (FIG. 7) may be subsequently formed.

Figure 15:
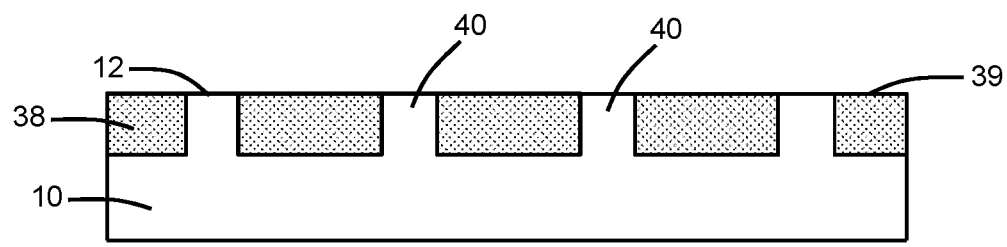
FIGS. 15-18 are cross-sectional views of a structure at successive fabrication stages of a processing method in accordance with embodiments of the invention.

With reference to FIG. 15 in which like reference numerals refer to like features in FIG. 1 and in accordance with an alternative embodiment, shallow trench isolation regions 38 may be provided by patterning the semiconductor material of the substrate 10 with lithography and etching processes to define trenches and forming planarized portions of a deposited dielectric material (e.g., silicon dioxide) in the trenches. The shallow trench isolation regions 38 may have a top surface 39 that is planar with the top surface 12 of the substrate 10. Portions 40 of the substrate 10 are positioned laterally in the spaces between the shallow trench isolation regions 38 and these portions 40 may provide a lattice or mesh of interconnected fins arrangement similar to the mesh arrangement of interconnected openings defined by the trenches 16. The shallow trench isolation regions 38 are surrounded by the portions 40 of the substrate 10 in the mesh.

Figure 16:
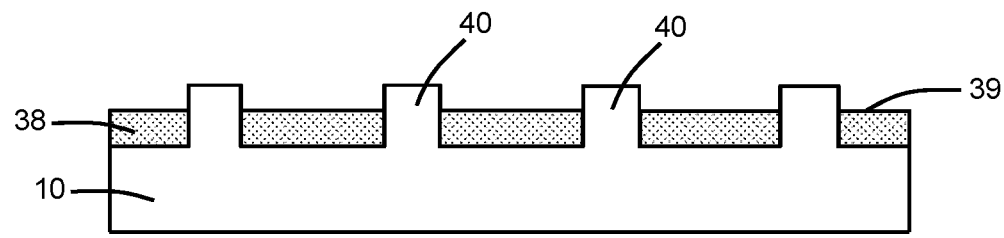

With reference to FIG. 16 in which like reference numerals refer to like features in FIG. 15 and at a subsequent fabrication stage of the processing method, the shallow trench isolation regions 38 are recessed relative to the portions 40 of the substrate 10 using a selective etching process. The recessing of the shallow trench isolation regions 38 increases a height of each portion 40 of the substrate 10 that is located above the recessed top surface 39 of the shallow trench isolation regions 38. After recessing, the shallow trench isolation regions 38 define a dielectric layer similar to the dielectric layer 14.

Figure 17:
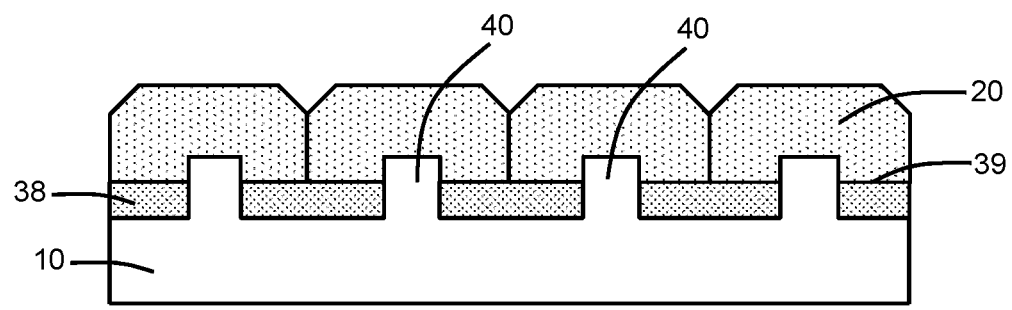

With reference to FIG. 17 in which like reference numerals refer to like features in FIG. 16 and at a subsequent fabrication stage of the processing method, the semiconductor layer 20 is formed by epitaxial growth from the portions 40 of the substrate 10 arranged above the top surface 39 of the shallow trench isolation regions 38. The semiconductor layer 20 grows as individual portions from the portions 40 of the substrate 10. The individual portions of the semiconductor layer 20 laterally overgrow over the top surface 39 of the shallow trench isolation regions 38 and merge to define a continuous coating over the dielectric layer 14. The recessed shallow trench isolation regions 38 are positioned in a vertical direction between the substrate 10 and the semiconductor layer 20 other than at the locations of the portions 40 of the substrate 10 that penetrate through the shallow trench isolation regions 38.

Figure 18:
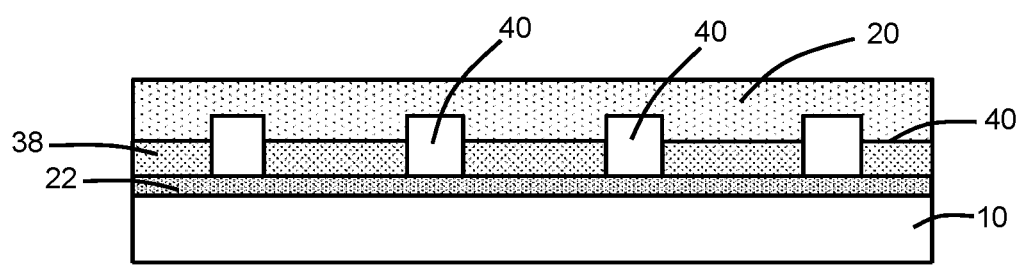

With reference to FIG. 18 in which like reference numerals refer to like features in FIG. 17 and at a subsequent fabrication stage of the processing method, processing may continue as described in connection with FIGS. 4 and 5 to planarize the semiconductor layer 20 and form the modified layer 22. In an embodiment, the portions 40 of the substrate 10 are covered by and buried in the semiconductor layer 20. The semiconductor layer 20 defines a continuous coating that is positioned over the recessed shallow trench isolation regions 38 and in direct contact with the shallow trench isolation regions 38. The field-effect transistors 24 and shallow trench isolation regions 23 (FIG. 6) may be subsequently formed in the semiconductor layer 20. Alternatively, the multi-finger field-effect transistor 30 (FIG. 7) may be formed.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a dielectric layer over a semiconductor substrate;
    patterning a plurality of openings in the dielectric layer that extend to the semiconductor substrate;
    epitaxially growing a semiconductor material from a plurality of portions of the semiconductor substrate that are respectively exposed inside the openings, wherein the semiconductor material, during growth, defines a semiconductor layer that includes a plurality of first portions respectively coincident with the openings and a plurality of second portions that laterally grow from the first portions to merge over a top surface of the dielectric layer;
    forming a damaged region in the semiconductor substrate; and
    thermally annealing the damaged region to form a modified layer containing a trap-rich semiconductor material in the semiconductor substrate.

2. The method of claim 1 wherein the modified layer is formed after the semiconductor material is epitaxially grown from the portions of the semiconductor substrate exposed inside the openings.

3. The method of claim 1 wherein the trap-rich semiconductor material is polycrystalline semiconductor material.

4. The method of claim 1 wherein the dielectric layer is positioned between the semiconductor layer and the semiconductor substrate.

5. The method of claim 1 further comprising:
forming a plurality of shallow trench isolation regions in the semiconductor layer,
wherein each shallow trench isolation region coincides in location with one of the openings in the dielectric layer.

6. The method of claim 5 wherein the modified layer is located in the semiconductor substrate beneath the dielectric layer and the shallow trench isolation regions.

7. The method of claim 1 wherein the openings in the dielectric layer define a mesh of interconnected trenches that surround a plurality of sections of the dielectric layer.

8. The method of claim 7 further comprising:
forming a plurality of shallow trench isolation regions in the semiconductor layer,
wherein each shallow trench isolation region coincides in location with the one of the openings in the dielectric layer.

9. The method of claim 8 wherein the shallow trench isolation regions extend fully through the modified layer.

10. The method of claim 1 wherein the modified layer is located in the semiconductor substrate beneath the dielectric layer.

11. The method of claim 1 wherein the modified layer is located in the first portions of the semiconductor layer.

12. The method of claim 1 wherein epitaxially growing the semiconductor material from the portions of the semiconductor substrate exposed inside the openings comprises:
epitaxially growing the first portions of the semiconductor layer from the portions of the semiconductor substrate exposed inside the openings with a first epitaxial growth process;
recessing the dielectric layer relative to the first portions of the semiconductor layer; and
epitaxially growing the second portions of the semiconductor layer from the first portions of the semiconductor substrate with a second epitaxial growth process.

13. The method of claim 1 wherein the modified layer is formed before the dielectric layer is formed.

14. The method of claim 1 further comprising:
forming a silicide layer including a plurality of sections respectively over the first portions of the semiconductor layer.

15. The method of claim 14 further comprising:
forming a plurality of contacts extending to the silicide layer,
wherein one of the contacts is coupled to each section of the silicide layer, and each of the first portions of the semiconductor layer includes a source/drain region of a field-effect transistor.

16. The method of claim 1 further comprising:
forming shallow trench isolation regions that surround a section of the semiconductor layer; and
forming a contact extending to the section of the semiconductor layer,
wherein the section of the semiconductor layer couples the contact to the semiconductor substrate to define a guard ring.

17. The method of claim 1 wherein the semiconductor substrate is a bulk silicon substrate.

18. A method comprising:
forming a plurality of shallow trench isolation regions in a semiconductor substrate;
recessing the shallow trench isolation regions relative to a plurality of portions of the semiconductor substrate that are surrounded by the shallow trench isolation regions;
epitaxially growing a semiconductor material from the portions of the semiconductor substrate, wherein the semiconductor material laterally grows from the portions of the semiconductor substrate to merge over a top surface of the shallow trench isolation regions to define a semiconductor layer;
forming a damaged region in the semiconductor substrate; and
thermally annealing the damaged region to form a modified layer containing a trap-rich semiconductor material in the semiconductor substrate.

19. The method of claim 18 wherein the semiconductor substrate is a bulk silicon substrate.

20. The method of claim 18 wherein the trap-rich semiconductor material is polycrystalline semiconductor material.

* * * * *